United States Patent [19]

Kawabata

[11] Patent Number: 4,744,715
[45] Date of Patent: May 17, 1988

[54] WAFER TRANSFER APPARATUS

[75] Inventor: Taturo Kawabata, Kawasaki, Japan
[73] Assignee: Fujitsu Limited, Kanagawa, Japan
[21] Appl. No.: 65,749
[22] Filed: Jun. 24, 1987

[30] Foreign Application Priority Data
Jun. 26, 1986 [JP] Japan .................. 61-150323

[51] Int. Cl.$^4$ .................................. B65G 65/23
[52] U.S. Cl. .......................... 414/331; 414/404; 414/416; 414/417; 414/419
[58] Field of Search ............... 414/331, 403, 404, 411, 414/416, 417, 419, 421, 425

[56] References Cited

U.S. PATENT DOCUMENTS 3,949,891 4/1976 Butler et al. .................. 414/404
4,566,841 1/1986 Ohmura et al. ................ 414/417

FOREIGN PATENT DOCUMENTS 1049662 2/1979 Canada .
0047132 3/1982 European Pat. Off. .
0134621 3/1985 European Pat. Off. .
3508516 9/1986 Fed. Rep. of Germany .
2548449 1/1985 France .
2156582 3/1984 United Kingdom .
2138775 10/1984 United Kingdom .

Primary Examiner—Robert J. Spar
Assistant Examiner—Stuart J. Millman
Attorney, Agent, or Firm—Armstrong, Nikaido, Marmelstein & Kubovcik

[57] ABSTRACT

Wafers stocked in a first wafer carrier are transferred to a second wafer carrier through a first opening and a second opening provided respectively in the first and the second wafer carriers by turning the first and the second wafer carriers so that the first and second openings are directed downward. The wafers in the first wafer carrier are supported by a wafer supporter provided in a wafer holder and are received in the wafer holder by moving down the supporter through the first opening which is directed downward facing a third opening in the wafer holder which is directed upward. The wafer holder carrying the wafers is shifted until the third opening faces the second opening in the second wafer carrier which is directed downward. The wafers held in the wafer holder are transferred to the second wafer carrier by moving up the wafer supporter and then the second wafer carrier is turned back, so that the transfer of the wafers is completed.

5 Claims, 4 Drawing Sheets

WAFER TRANSFER APPARATUS

BACKGROUND OF THE INVENTION

1. Field of the Invention

The present invention relates to a wafer transfer apparatus, and more particularly, it relates to an apparatus for transferring a plurality of wafers from one wafer carrier to another in a fabricating process of semiconductor devices.

2. Description of the Prior Art

Generally, semiconductor devices are fabricated on a wafer, and wafer carriers, which will be simply called "carriers" hereinafter, are used for carrying or stocking the wafers in the fabricating process of the semiconductor devices. Since the usage of the carriers depends on a respective process of fabricating the semiconductor devices, it is necessary to transfer the wafers from one carrier used in a former process to another carrier in a next process. Therefore, it is important that the apparatus for transferring the wafers, which will be called "a wafer transfer apparatus" hereinafter, operates in a stable manner because the wafers are very delicate.

The carrier usually has an external shape of an approximately rectangular prism as shown in FIGS. 1(a) and 1(b), and one side (a first side) of the carrier is open for providing a first opening for receiving or taking out the wafers W from the carrier. A plurality of wafers W, twenty five wafers for example, can be held in the carrier, arranged in parallel leaving a space of 4.76 mm between adjacent wafers.

There are two types of carriers: a process type and a box type. FIG. 1(a) shows a typical process type carrier which is to be used in a wafer process such as a process of washing, photo lithography, etching, diffusion and heat treatment. The process type carrier is made of, for example, quartz glass or plastics. The process carrier has another opening, which will be called "a second opening" hereinafter, in the side opposite to the first opening. The second opening is for moving the wafers back and forth from the exterior of the process type carrier. FIG. 1(b) shows a typical box type carrier for transporting or stocking the wafers. The box type carrier is made of, for example, plastic and only has the first opening because the less opening the better in order to keep out dust during the transportation or the stocking.

A wafer transfer apparatus is for transferring the wafers W from one wafer carrier to another. In FIG. 2, a typical, prior art wafer transfer apparatus and two box type carriers C1 and C2 mounted on a turn table 1 of the wafer transfer apparatus are illustrated. A schematic side view for the prior art wafer transfer apparatus and a schematic sectional side view are depicted for the box type carriers C1 and C2. FIG. 2 shows that the wafers W stocked in the box type carrier C1 which are to be transferred to the box type carrier C2, using a wafer transfer unit 2 of the wafer transfer apparatus. In FIG. 2, the turn table 1 of the wafer transfer apparatus is turned on an axis 1a thus turning the box type carriers C1 and C2 simultaneously. When the wafers W in the box type carrier C1 are transferred to the box type carrier C2, the transfer is carried out in accordance with the following steps of: (1) turning the box type carrier C1 so that the opening (the first opening) of the carrier C1 faces the wafer transfer unit 2 (FIG. 2 shows this state); (2) inserting arms 2a of the wafer transfer unit 2 into the spaces between the wafers W by shifting the wafer transfer unit 2 in a direction B; (3) chucking a wafer W placed above each arm 2a by using a chuck 2b equipped on each arm 2a; (4) shifting the wafer transfer unit 2 back in a direction A thereby removing the wafers W from the carrier C1; (5) turning the turn table 1 so that the opening (the first opening) of the carrier C2 faces the wafer transfer unit 2; (6) inserting the wafers W into the carrier C2 by shifting the wafer transfer unit 2 in the direction B; (7) placing the wafers W in the carrier C2 by releasing the chuck 2b; and (8) shifting the wafer transfer unit 2 back in the direction A.

However, in the above steps, particularly in the above step (2), since the space between the wafers in the carrier C1 or C2 is very narrow as described before, the arm 2a must be very thin and, therefore, the arm 2a is mechanically very weak. Accordingly, in the wafer transfer apparatus of the prior art, it is very hard to correctly position the end of arms 2a between the wafers in the carrier C1 and the insertion of the arms 2a becomes unstable. This is a first problem in the wafer transfer apparatus of the prior art.

The above first problem may be solved if the arms 2a are not used, and this may be achieved by applying an idea of the Japanese Laid-Open patent No. 50-34481 to Jun Suzuki, which will be called as "Suzuki" hereinafter. According to "Suzuki", wafers can be transferred from one carrier to another without using arms. Namely, wafers are transferred using the weight of the wafers themselves. Each of two carriers used in "Suzuki" is a process type having a first opening through which wafers are transferred and a second opening through which a supporter corresponding to each carrier is inserted into the carrier. The first opening and the second opening of each carrier are located on sides opposite to each other. The transfer of the wafers is carried out in accordance with the following steps:

(1) A first carrier, in which wafers to be transferred are stocked, is set so that a side of the first opening of the first carrier is directed upward. The wafers are supported by a first supporter which corresponds to the first carrier and is inserted into the first carrier through the second opening of the first carrier so that the wafers are supported on the first supporter.

(2) A second carrier, to which the wafers will be transferred, is put on the first carrier so that the first opening of the second carrier is directed downward and joined to the first opening of the first carrier. Then, a second supporter corresponding to the second carrier, supports the wafers so as to touch the upper side of the wafers.

(3) The first and second carriers which are joined together are turned upside down and the wafers in the first carrier are transferred to the second carrier using their own weight by moving the second supporter of the second carrier downward. At that time, the first supporter of the first carrier is also moved down lightly touching the upper side of the wafers.

(4) The first carrier is separated from the second carrier, and the transfer of the wafers is, thus, completed.

In the above explanation, the second supporter is necessary for preventing the wafers from rolling down into the second carrier during the transference of the wafers, and the first supporter works so that the wafers can be transferred smoothly irregular transferring motion is avoided. As can be seen from the above explanation of the steps, the second openings of the first and the second carriers are necessary to allow the first and the second supporters to operate. Thus, "Suzuki" can be used only when the carriers are the process type, in other words, the box type carriers cannot be used in "Suzuki" because the box type carrier has only the first opening. This is a second problem.

SUMMARY OF THE INVENTION

An object of the present invention is to transfer the wafers from one carrier to another without using arms as in the prior art.

Another object of the present invention is to transfer the wafers from one carrier to another in a stable manner without damaging the wafers.

Still another object of the present invention is to use not only the process type carrier but also the box type carrier with the wafer transfer apparatus for transferring the wafers.

The above objects are achieved by providing a wafer holder for temporarily holding the wafers during the transfer of the wafers from one carrier (a first carrier) to another carrier (a second carrier), wherein the wafer holder has an opening (a third opening), directed upward, through which the wafers are transferred. The first and the second carriers are turned so that a first and a second opening provided respectively in the first and the second carriers, are directed downward for facing the third opening. A wafer supporter is provided for supporting the wafers when the wafers are transferred from the first carrier to the wafer holder and from the wafer holder to the second carrier. A wafer maintainer is provided in the first and second carriers for maintaining the wafers in the first and the second carriers when the first and the second carriers are turned to direct the first and the second openings downward. This prevents the wafers from falling from the first and the second carriers when the carriers are turned. A wafer holder moving means carries the wafers held in the wafer holder from a point at which the third opening faces the first opening to another point at which the third opening faces the second opening. According to the present invention, the wafers can be thus transferred by using the weight of the wafers themselves rather than using the arms as in the prior art. Thus, the transfer of the wafers can be done in a stable manner without damaging the wafers. Furthermore, according to the present invention, only one opening in each carrier is necessary to transfer the wafers, which means that not only a process type carrier but also a box type carrier can be used in the wafer transfer apparatus of the present invention.

DESCRIPTION OF THE PREFERRED EMBODIMENTS

Figure 1A:
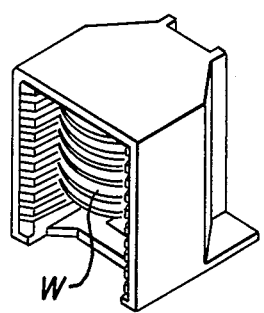
FIG. 1(a) is a schematic perspective illustration of a process type carrier.
Figure 1B:
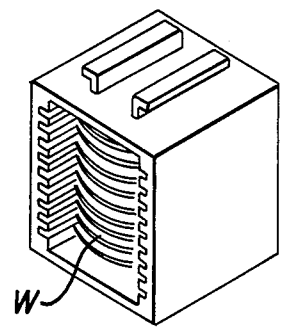
FIG. 1(b) is a schematic perspective illustration of a box type carrier.
Figure 2:
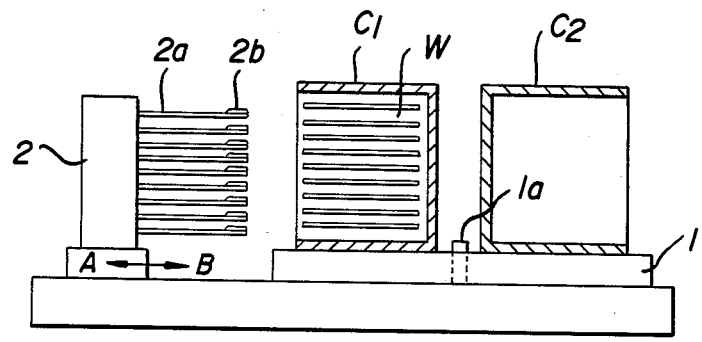
FIG. 2 is a schematic side view of a prior art wafer transfer apparatus.

A wafer transfer apparatus embodying the present invention will be explained referring to FIGS. 3, 4, and 5(a)-5(e). Throughout the figures, the same reference numeral or symbol designates the same part or unit.

Figure 3:
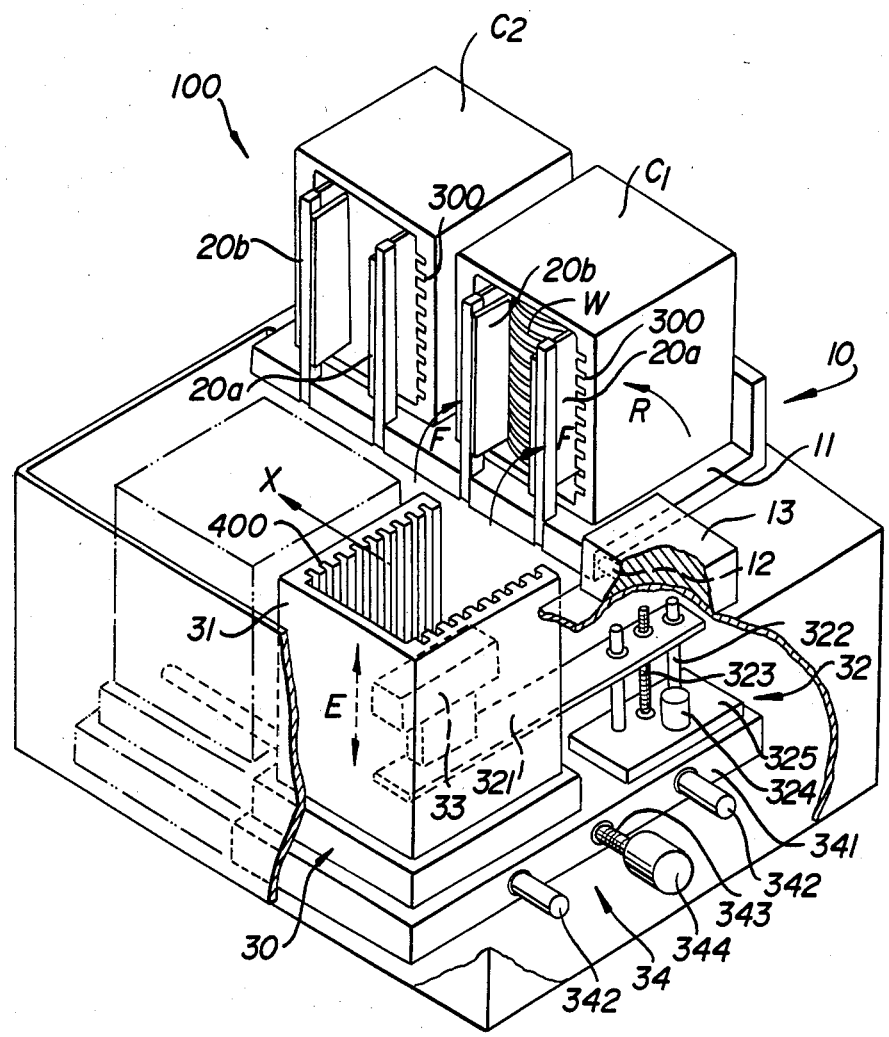
FIG. 3 is a schematic perspective illustration of a wafer transfer apparatus embodying the present invention.

In FIG. 3, wafers W are stocked in a box type carrier C1 and are intended to be transferred to another box type carrier C2. The carriers C1 and C2 are mounted on and fixed to a table 11 of a carrier stage 10 of the wafer transfer apparatus 100, and the wafers W are set horizontally in grooves 300 in the carriers C1 and C2 respectively, which may be made of a resin, for example.

A wafer transferring unit 30 is located below the carrier stage 10 and comprises a wafer holder 31, a supporter elevating mechanism 32 having an elevating arm 321 with a wafer supporter 33 fixed to the end thereof. The arm 321 and supporter 33 are made of resin, for example. A holder shifting mechanism 34 is also included in the transferring unit 30. The holder shifting mechanism 34 comprises a first pedestal 341 which is shifted horizontally in a direction shown by an arrow X when the wafers W are transferred from the wafer carrier C1 to C2. The shift is performed along first guide rods 342 by a driving screw 343 which is driven by a first motor 344. The wafer holder 31 and the supporter elevating mechanism 32 are mounted on and fixed to the first pedestal 341. The supporter elevating mechanism 32 comprises a second pedestal 325, second guide rods 322, a second driving screw 323, a second motor 324, and the elevating arm 321. The elevating arm 321 is driven up and down by the rotation of the second driving screw 323 driven by the second motor 324, so that the wafer supporter 33 is moved up and down by the wafer holder 31 as shown by an arrow E. As seen in FIG. 3, two sides of the wafer holder 31 are open, one of which is directed upward for allowing the transferring of the wafers, and the other of which is located at the side of the wafer holder 31 for allowing the arm 321 to move up or down to elevate or lower the wafer supporter 33. Usually, the wafer supporter 33 is positioned at the bottom of the wafer holder 31. When the wafers W are transferred to the wafer holder 31, the wafer supporter 33 is elevated to accept the wafers W.

Figure 4:
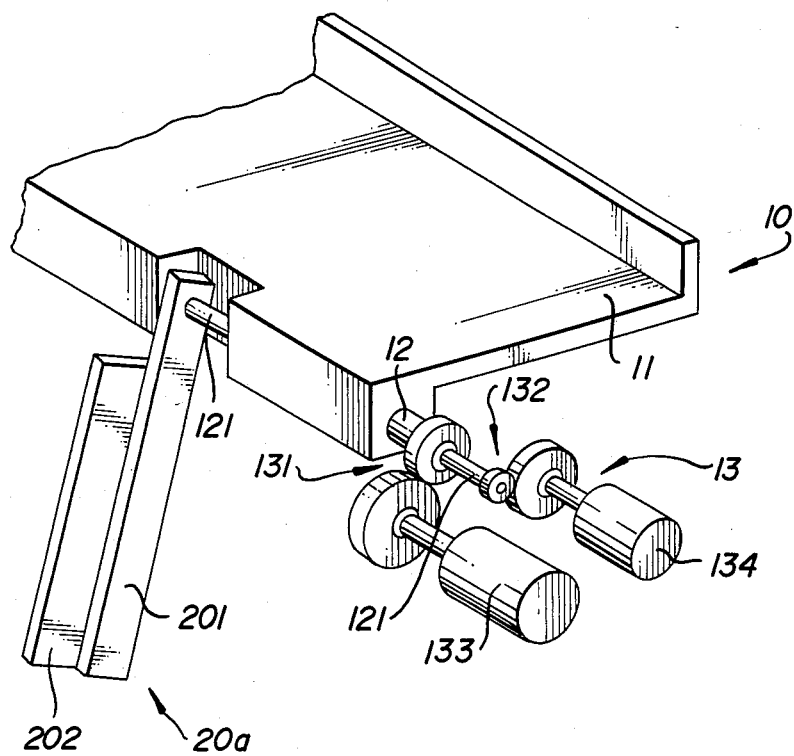
FIG. 4 is a rotary mechanism for operating a wafer maintainer and a carrier stage of a wafer transfer apparatus embodying the present invention.
Figure 5A:
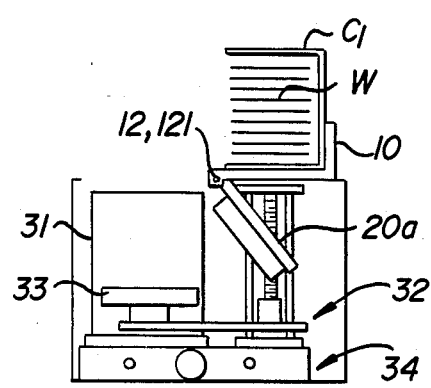
FIGS. 5(a)-5(e) are illustrations for showing the operating steps of a wafer transfer apparatus embodying the present invention.
Figure 5B:
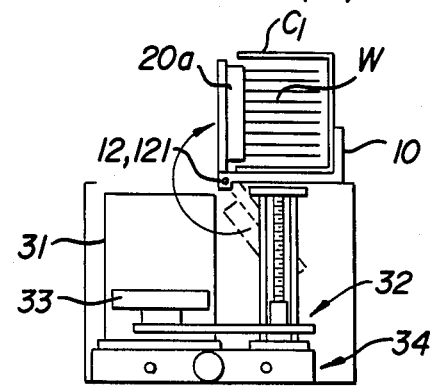
Figure 5C:
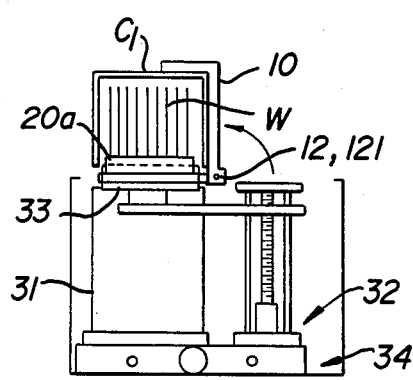
Figure 5D:
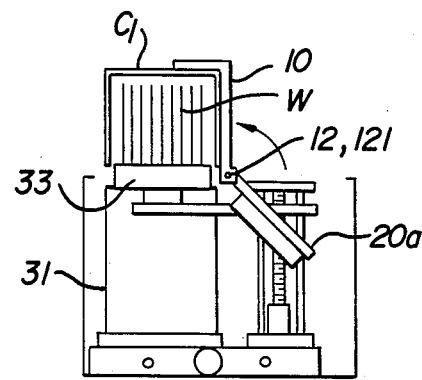
Figure 5E:
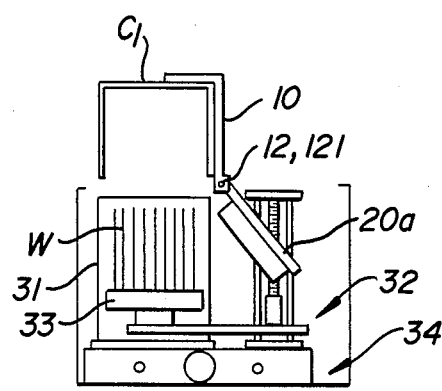

When the wafers W are transferred from one carrier (the carrier C1 in FIG. 3) to another (the carrier C2), the carrier stage 10 is turned on an axis 12 approximately one-fourth revolution with the carriers C1 and C2 mounted thereon as shown by the arrow R in FIG. 3, until the opening of the carrier C1 faces the opening of the wafer holder 31 with a slight space therebetween. At each opening of the carriers C1 and C2, a pair of wafer maintainers 20a and 20b are provided. Each wafer maintainer 20a or 20b comprises a second arm 201 and an attaching part 202 as shown in FIG. 4; wherein, the attaching part 202 which lightly holds the wafer W is made of resin, for example. In FIG. 3, the wafers W stocked in the carrier C1 are maintained therein by the wafer maintainers 20a and 20b. This is for avoiding the wafers W falling from the carrier C1 when the carrier stage 10 is turned to direct the opening of the carrier C1 downward. When the carriers C1 and C2 are mounted on the carrier stage 10, the wafer maintainers 20a and 20b are positioned below the wafer stage 10 as shown in FIG. 5(a). After the carriers C1 and C2 are mounted on the table 11 of the carrier stage 10, the wafer maintainers 20a and 20b are turned on an axis 121 as shown by arrows F in FIG. 3, until the wafers W in the wafer carrier C1 are maintained by the wafer maintainers 20a and 20b as shown in FIG. 5(b). After the openings of the carrier C1 and the wafer holder 31 face each other having a space therebetween, the wafers W stocked in the carrier C1 are accepted by the wafer supporter 33 as shown in FIG. 5(c). Then, the wafer maintainers 20a and 20b are turned on the axis 121 so as to be at an initial position shown in FIG. 5(a), so that the wafers W are on the wafer supporter 33 as shown in FIG. 5(d). After that, as shown in FIG. 5(e), the supporter elevating mechanism 32 moves the wafer supporter 33 downward thereby moving the wafers W into grooves 400 in wafer holder 31, which are made of, for example, resin. After moving of the wafers W into the wafer holder 31 is completed, the holder shifting mechanism 34 shifts the wafer holder 31 until the opening of the wafer holder 31 is positioned just below the downwardly directed opening of the other carrier C2. Then the wafer supporter 33 is elevated until the wafers W, which are on the wafer supporter 33, are transferred to the carrier C2. After the wafers W are transferred into the carrier C2, the wafer maintainers 20a and 20b are turned so that the wafer maintainers 20a and 20b maintain the wafers W which have been stocked in the carrier C2. Then, the carrier stage 10 is turned back on the axis 12 approximately one-fourth revolution so that the carrier stage 10 is at an initial position as shown in FIG. 3. After that, the wafer maintainers 20a and 20b are turned back to the initial position as shown in FIG. 5(a).

In FIG. 3, a rotary mechanism 13 turns the carrier stage 10 and the wafer maintainers 20a and 20b. In FIG. 4, the axis 12 is provided for rotating the wafer stage 10 approximately one-fourth revolution as explained above. The axis 13 is a double axis having an outer tube formed on axis 12 for rotating the wafer stage 10 and an inner axis 121 is for rotating the wafer maintainers 20a and 20b. As shown in FIG. 4, the outer axis 12 is driven by a third motor 133 through a first gear train 131, and the inner axis 121 is driven by a fourth motor 134 through a second gear train 132.

In FIG. 3, the first motor 344 is for shifting the holder shifting mechanism 34, the second motor 324 is for driving the supporter elevating mechanism 32, the first, second, third, and fourth motors mentioned above can be automatically driven in accordance with, for example, a predetermined program. The wafer carriers are usually mounted on the apparatus by hand. However, the apparatus can be set on the path of a line for a wafer carrier transportation. In this case, the carriers can be automatically mounted on and demounted from the carrier stage of the wafer transfer apparatus.

As explained above, in the wafer transfer apparatus of the present invention, the transferring of the wafers can be performed very smoothly because there are no unstable elements such as arms as in the prior art. Furthermore, the wafer transfer apparatus of the present invention can transfer the wafers only using the opening for transferring the wafers. In other words, even though a box type carrier is used, the wafers can be transferred; that is, there is no necessity to use other openings such as the second opening of a process type carrier.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

I claim:

1. A wafer transfer apparatus for transferring wafers in a first wafer carrier having a first opening to a second wafer carrier having a second opening, said apparatus comprising:

a carrier turning means for turning the first and the second wafer carriers so that the first and the second openings are directed downward, a wafer holding means for holding the wafers which are being transferred from the first wafer carrier to the second wafer carrier, said wafer holding means comprising a third opening directed upward for facing the first opening when directed downward for transferring wafers to the wafer holding means and for facing the second opening when directed downward for transferring wafers to the second wafer carriers, wherein said wafer holding means moves to position the third opening to face the first opening when directed downward and the second opening when directed downward, and a wafer supporting means for supporting the wafers which are being transferred from the first wafer carrier to the wafer holding means when the wafers are being transferred to the wafer holding means, and for supporting the wafers which are being transferred from the wafer holding means to the second wafer carrier means when the wafers are being transferred to the second wafer carrier.

2. A wafer transfer apparatus according to claim 1 further comprising a first wafer maintaining means and a second wafer maintaining means, said first wafer maintaining means maintaining the wafers in the first wafer carrier when the first wafer carrier is being turned from an initial state to a second state in which the first opening is directed downward, said second wafer maintaining means maintaining the wafers supported by the wafer supporter means until the second wafer carrier is turned back to an initial state.

3. A wafer transfer apparatus for transferring wafers in a first wafer carrier having a first opening to a second wafer carrier having a second opening, said apparatus comprising:

a carrier stage for mounting and fixing the first wafer carrier and the second wafer carrier, a carrier stage turning means for turning said carrier stage from an initial state of the first and the second wafer carriers to a second state in which the first and the second openings are directed downward, a wafer holder means for receiving the wafers from the first wafer carrier turned by the carrier stage turning means and for holding the received wafers so that the held wafers are arranged vertically until the held wafers are transferred to the second wafer carrier, said wafer holder means having a third opening, directed upward, through which the wafers are received from the first wafer carrier when said third opening faces the first opening when directed downward and through which wafers are transferred to the second wafer carrier when said third opening faces the second opening when directed downward, wherein said wafer holder means is moved between a first position where said third opening faces the first opening when directed downward and a second position where said third opening faces the second opening when directed downward, a wafer supporter means, provided in the wafer holder, for supporting the wafers which are being transferred from the first wafer carrier to the wafer holder means, for receiving the wafers in the wafer holder and for supporting the received wafers for transferring the wafers to the second wafer carrier, said wafer supporter means being moved up when the wafers are being transferred from the first wafer carrier to the wafer holder means, moved down when the wafers are received and held in the wafer holder and moved up when the held wafers are transferred to the second wafer carrier, a wafer supporter elevating means for moving said wafer supporter means up and down, a wafer holder moving means for moving the wafer holder means together with the wafer supporter elevating means from the first position to the second position when the wafers are transferred from the first wafer carrier to the second wafer carrier, and a wafer maintainer means for maintaining the wafers in the first and the second wafer carriers when said wafer stage is turned for directing the first and the second openings downward, said wafer maintainer means maintaining the wafers in the first and the second wafer carriers from the exterior of the first and the second openings, wherein said wafer maintainer means comprises a first maintainer for maintaining the wafers in the first wafer carrier when the wafer stage is turned so that the first opening is directed downward, the first maintainer being released when the wafer supporter means supports the wafers which are transferred from the first wafer carrier to the wafer holder means, and a second maintainer for maintaining the wafers in the second wafer carrier when the wafer supporter means supports the wafers and the wafers are transferred to the second wafer carrier, the second maintainer being released when said wafer stage is turned back to the initial state.

4. A wafer transfer apparatus according to claim 3, wherein said wafer supporter means is made of resin.

5. A wafer transfer apparatus according to claim 3 or 4, wherein each of said first and said second maintainers comprises an attaching portion, made of resin, for directly maintaining the wafers in the first and the second wafer carriers.

* * * * *